(12) United States Patent
Drost et al.

(10) Patent No.: US 7,067,910 B2
(45) Date of Patent: Jun. 27, 2006

(54) METHOD AND APPARATUS FOR USING CAPACITIVELY COUPLED COMMUNICATION WITHIN STACKS OF LAMINATED CHIPS

(75) Inventors: Robert J. Drost, Mountain View, CA (US); Ronald Ho, Mountain View, CA (US); Arthur R. Zingher, San Diego, CA (US)

(73) Assignee: SUN Microsystems, Inc., Santa Clara, CA (US)

( * ) Notice: Subject to any disclaimer, the term of this patent is extended or adjusted under 35 U.S.C. 154(b) by 13 days.

(21) Appl. No.: 10/966,510

(22) Filed: Oct. 14, 2004

(65) Prior Publication Data
US 2006/0017147 A1 Jan. 26, 2006

Related U.S. Application Data

(60) Provisional application No. 60/562,037, filed on Apr. 13, 2004.

(51) Int. Cl.
*H01L 23/02* (2006.01)
(52) U.S. Cl. ............... 257/686; 257/691; 257/723; 257/777; 438/108; 438/109
(58) Field of Classification Search .............. None
See application file for complete search history.

(56) References Cited

U.S. PATENT DOCUMENTS

| | | | |
|---|---|---|---|
| 5,241,456 A * | 8/1993 | Marcinkiewicz et al. ... | 361/792 |
| 5,280,192 A * | 1/1994 | Kryzaniwsky ............. | 257/723 |
| 5,629,838 A * | 5/1997 | Knight et al. ............. | 361/782 |
| 5,744,862 A * | 4/1998 | Ishii ......................... | 257/693 |
| 6,297,548 B1 * | 10/2001 | Moden et al. ............. | 257/686 |
| 6,728,113 B1 | 4/2004 | Knight et al. ............. | 361/760 |
| 6,734,541 B1 * | 5/2004 | Shimoe et al. ............. | 257/686 |
| 6,784,530 B1 * | 8/2004 | Sugaya et al. ............. | 257/686 |
| 6,870,271 B1 * | 3/2005 | Sutherland et al. ......... | 257/777 |
| 6,916,719 B1 * | 7/2005 | Knight et al. ............. | 438/381 |
| 2002/0016021 A1 * | 2/2002 | Sutherland ................. | 438/107 |

OTHER PUBLICATIONS

Saltzman D.; Knight, T., Jr. Capacitive coupling solves the known good die problem. Multi-Chip Module Conference, 1994. MCMC-94, Proceedings., 1994 IEEE Mar. 15-17, 1994 pp.: 95-100.*

Cotton, C.D.; Kling, D.R.; Sebesta, G. Design and development challenges for complex laminate multichip modules. Multichip Modules, 1997., 6th International Conference on Apr. 2-4, 1997 pp.: 196-201.*

* cited by examiner

*Primary Examiner*—David Nelms
*Assistant Examiner*—Earl Taylor
(74) *Attorney, Agent, or Firm*—Park, Vaughan & Fleming, LLP

(57) ABSTRACT

One embodiment of the present invention provides a technique for assembling semiconductor chips. First, multiple semiconductor chips are permanently laminated together into a plurality of laminated chip assemblies, wherein the semiconductor chips within the laminated chip assembly communicate with each other through electrically conductive connections. Next, laminated chip assemblies are stacked together to form a stack of semiconductor chips without permanently bonding the laminated chip assemblies together, wherein the laminated chip assemblies communicate with each other using capacitive coupling.

20 Claims, 2 Drawing Sheets

METHOD AND APPARATUS FOR USING CAPACITIVELY COUPLED COMMUNICATION WITHIN STACKS OF LAMINATED CHIPS

RELATED APPLICATION

This application hereby claims priority under 35 U.S.C. §119 to U.S. Provisional Patent Application No. 60/562,037, filed on 13 Apr. 2004, entitled "Stacked Chips and Proximity Communication," by inventor Robert J. Drost.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to techniques for communicating between integrated circuits. More specifically, the present invention relates to a method and an apparatus for using capacitively coupled communication techniques to communicate between stacked assemblies of laminated integrated circuit (IC) chips.

2. Related Art

Advances in semiconductor technology have made it possible to fabricate a single IC (Integrated Circuit) chip that contains hundreds of millions of transistors. One of the advantages of integrating systems onto a single IC chip is that it increases the operating speed of the overall system. This is because in a multiple chip solution, the signals between system components have to cross chip boundaries, which typically reduces the system's operating speed due to the lengthy chip-to-chip propagation delays and limited chip-to-chip wires. In contrast, in a single chip solution, the signals between system components no longer have to cross chip boundaries, resulting in a significant increase in the overall system speed. Moreover, integrating systems onto a single IC chip significantly reduces overall costs, because fewer chips are required to perform a given computational task.

However, some systems cannot be integrated into a single chip due to their high complexity and large size. Note that IC chips are typically integrated onto a printed circuit board that contains multiple layers of signal lines for inter-chip communication. Furthermore, signal lines on an IC chip are about 100 times more densely packed than signal lines on a printed circuit board. Consequently, only a tiny fraction of the signal lines on a chip can be routed across the printed circuit board to other chips. Because of this reason, in such systems, inter-chip communication becomes the bottleneck for increasing the operating speed. Moreover, increases in IC integration densities are expected to exacerbate this bottleneck.

To overcome this inter-chip communication bottleneck, researchers have recently developed an alternate technique, known as "Proximity Communication," for communicating between semiconductor chips. Proximity Communication involves integrating arrays of capacitive transmitters and receivers onto active surfaces of IC chips to facilitate inter-chip communication. If a first chip is situated face-to-face with a second chip so that transmitter regions on the first chip are capacitively coupled with receiver regions on the second chip, it is possible to transmit signals directly from the first chip to the second chip without having to route the signal through intervening signal lines within a printed circuit board.

Unfortunately, because proximity communication requires chips to be face-to-face it is not possible to stack more than two chips on top of each other. Hence, in order to couple a large number of chips together, it is necessary to arrange the chips so that they partially overlap in a pattern that alternates face-up and face-down chip orientations. This interconnection constraint can make it very hard to effectively combine such chips into a three-dimensional structure to save space and to reduce propagation delays between chips.

In addition to proximity communication techniques, a number of methods exist to laminate or permanently attach chips together and to create electrically conductive connections between the laminated chips. These laminated chip assemblies offer higher performance and faster communication, but suffer from the known-good-die problem.

The known-good-die problem arises from the fact that it is not possible to fully test a die at the wafer level or bare-die level. During wafer-level testing, faulty IC chips can be identified, but this technique is error prone, because chips must be assembled to be fully tested. Furthermore, since a single faulty chip can ruin an entire multi-chip assembly, the yield for a multi-chip assembly can be intolerably low for assemblies consisting of more than a few chips. For example, if a die lot has an actual yield of 80% (or 0.8), the cumulative yield for an assembly of three laminated dies is $0.8^3 \approx 0.5$, while the cumulative yield for an assembly often laminated dies is $0.8^{10} \approx 0.11$. A low yield can result in a prohibitively high per-chip cost.

Hence what is needed is a high-bandwidth, low-latency inter-chip communication method that does not suffer from the abovementioned drawbacks.

SUMMARY

One embodiment of the present invention provides a technique for assembling semiconductor chips. First, multiple semiconductor chips are permanently laminated together into a plurality of laminated chip assemblies, wherein the semiconductor chips within the laminated chip assembly communicate with each other through electrically conductive connections. Next, laminated chip assemblies are stacked together to form a stack of semiconductor chips without permanently bonding the laminated chip assemblies together, wherein the laminated chip assemblies communicate with each other using capacitive coupling.

Note that using this technique to stack (but not permanently bond) laminated chip assemblies together to form the stack of semiconductor chips reduces the yield problem that exists for large stacks of permanently bonded semiconductor chips. Furthermore, using electrically conductive connections for inter-chip communication within the laminated chip assembly reduces the interconnection constraints that are imposed due to the face-to-face chip orientation requirements of purely capacitive coupling techniques.

In a variation of this embodiment, power is provided to the stack of semiconductor chips while avoiding the permanent attachment of a power supply to the stack of semiconductor chips.

In a further variation, providing power to the stack of semiconductor chips involves using one or more of the following: capacitive coupling; inductive coupling; springs; fuzzbuttons; and anisotropic sheets.

In a variation of this embodiment, creating the electrically conductive connections between semiconductor chips in a laminated chip assembly involves using through-chip vias.

In a variation of this embodiment, the semiconductor chips in a laminated chip assembly can be different sizes and have different thicknesses.

In a variation of this embodiment, assembling the stack of semiconductor chips involves placing the laminated chip assemblies in an array, particularly a two-dimensional array. The two-dimensional array is arranged such that the capacitive communication regions are alternately oriented face-up and face-down on overlapping edges of the laminated chip assemblies.

In a further variation, assembling the stack of semiconductor chips involves stacking laminated chip assemblies to form a three-dimensional array.

In a variation of this embodiment, the laminated chip assembly can include a carrier chip, which is laminated to one or more semiconductor chips. Note that the carrier chip is used to transfer signals from one laminated chip assembly to another laminated chip assembly.

In a variation of this embodiment, a laminated chip assembly is removed from the stack of semiconductor chips and replaced when one of the semiconductor chips in the laminated chip assembly is malfunctioning.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Inter-Chip Communication Using Proximity Communication

Figure 1:
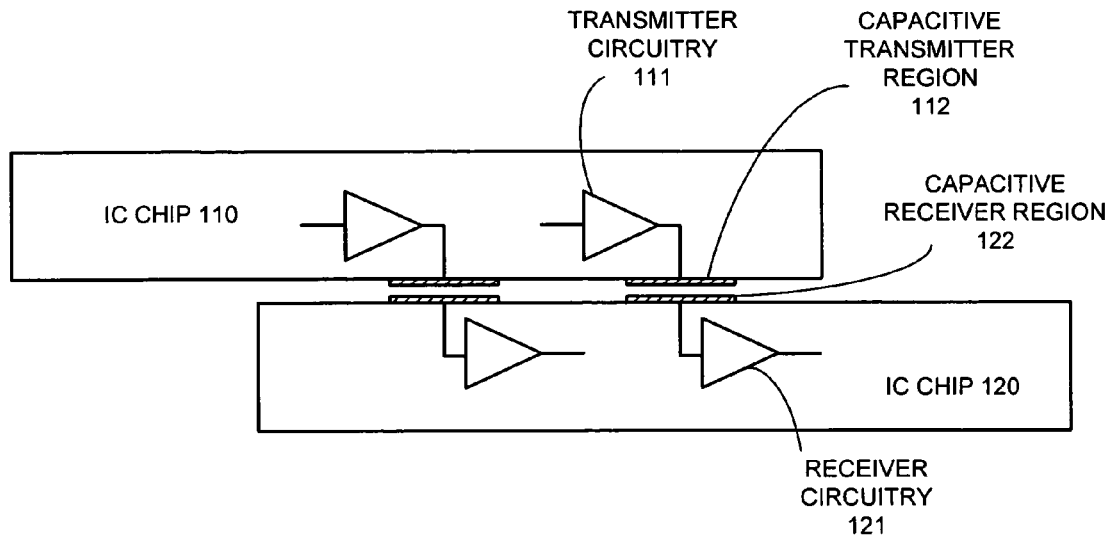
FIG. 1 illustrates semiconductor chips which use proximity communication in accordance with an embodiment of the present invention.

FIG. 1 illustrates semiconductor chips which use proximity communication in accordance with an embodiment of the present invention. As illustrated in FIG. 1, IC chip 110 contains transmitter circuitry 111, which feeds a signal into a capacitive transmitter region 112 in IC chip 110. This signal is capacitively transmitted to capacitive receiver region 122, and then passes into receiver circuitry 121 in IC chip 120. Note that when the transmitter and receiver regions are properly aligned, there is no direct physical contact between the transmitter and receiver regions, and signals are communicated between transmitter and receiver regions through capacitive coupling.

Proximity Communication Between Laminated Chip Assemblies

Figure 2:
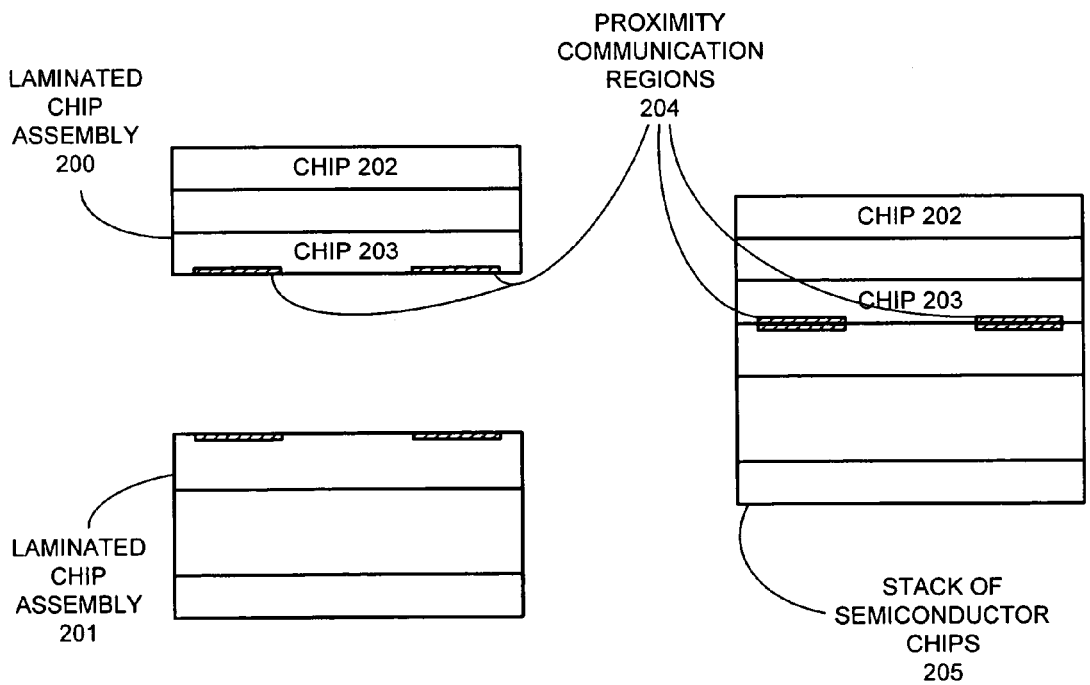
FIG. 2 illustrates a stack of semiconductor chips which uses proximity communication between laminated chip assemblies in accordance with an embodiment of the present invention.

FIG. 2 illustrates a stack of semiconductor chips 205 which uses proximity communication between laminated chip assemblies in accordance with an embodiment of the present invention.

Laminated chip assemblies 200 and 201 are multi-chip assemblies wherein the constituent IC chips have been permanently laminated together using one of a number of known bonding techniques. Within laminated chip assemblies 200 and 201, communication occurs through direct electrically conductive connections. In other words, when chip 202 sends a signal to chip 203, the signal passes through a conductor directly from chip 202 to chip 203. Note that these conductors can possibly include through-chip vias.

In contrast, laminated chip assembly 200 and laminated chip assembly 201 communicate with each other not through direct electrical connections, but instead through proximity communication (across proximity communication regions 204).

Since there is no physical wiring between laminated chip assembly 200 and laminated chip assembly 201, no mechanical attachment is required. Hence, either laminated chip assembly 200 or laminated chip assembly 201 can be removed and replaced with an equivalent laminated chip assembly. Because either laminated chip assembly can be replaced, the failure of a single chip does not require the replacement of the entire stack of semiconductor chips 205, only the replacement of a single laminated chip assembly. Hence, the stack of semiconductor chips 205 has the connectivity advantages of laminated chip assemblies with respect to bandwidth, latency, and packing size while maintaining acceptable yields.

Through-Chip Vias

Figure 3:
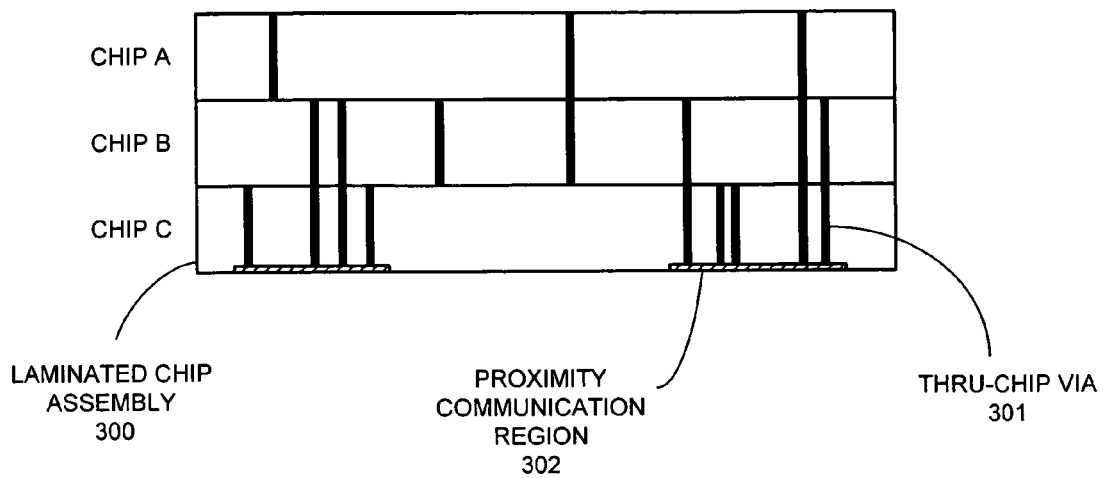
FIG. 3 illustrates through-chip vias in a laminated chip assembly in accordance with an embodiment of the present invention.

FIG. 3 illustrates through-chip vias in a laminated chip assembly 300 in accordance with an embodiment of the present invention. Laminated chip assembly 300 includes proximity communication region 302 and through-chip via 301.

Proximity communication normally takes place on the top surface of an IC chip within a laminated chip assembly, by utilizing the top layer or layers of the IC chip to facilitate capacitive coupling. However, proximity communication may utilize the bottom surface of the IC chip (through the silicon or insulator substrate material) using through-chip vias and metallization to construct proximity communication regions. Note that through-chip vias may already be used to conductively interconnect the laminated stack of chips, but through-chip vias can also be used to connect circuits within the non-interface IC chips of a laminated chip assembly (such as chip A and chip B in FIG. 3) to a proximity communication region.

Before being assembled, through-chip vias in each IC chip in laminated chip assembly 300 are etched and filled with metal. During assembly, an electrically conductive connection is made for the through-chip via 301 between chip A, chip B and chip C. Once electrically connected, the signal source in chip A can communicate with IC chips outside laminated chip assembly 300 through proximity communication region 302 located in chip C.

Two-Dimensional Tiled Arrays of Laminated Chip Assemblies

Figure 4:
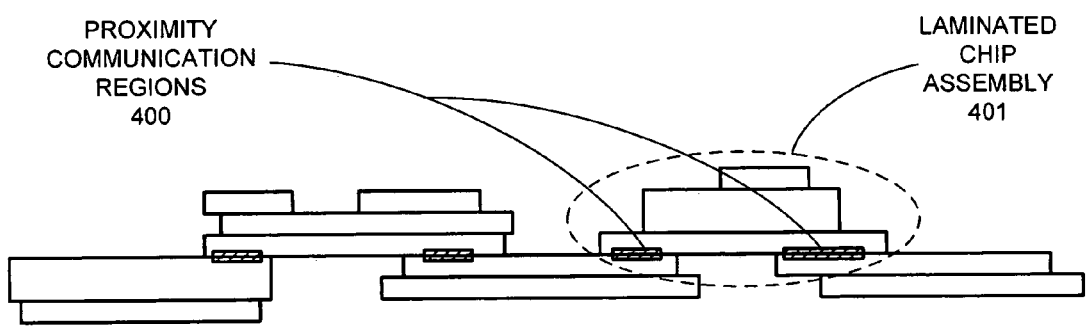
FIG. 4 illustrates a tiled (two-dimensional) array of laminated chip assemblies in accordance with an embodiment of the present invention.

FIG. 4 illustrates a tiled (two-dimensional) array of laminated chip assemblies in accordance with an embodiment of the present invention. This two-dimensional array includes laminated chip assembly 401 and proximity communication regions 400. Laminated chip assembly 401 communicates to other laminated chip assemblies in the two-dimensional array via proximity communication regions 400.

Note that laminated chip assembly 401 is composed of IC chips of various sizes. The laminated chip assemblies can communicate with each other as long as their proximity communication regions align; there is no requirement that the constituent IC chips of the laminated assemblies have the same physical dimensions.

Note also that the IC chip that includes the proximity communication region can be a carrier. This only transfers signals and does not contain any active circuits. In this type of system, a signal may travel across several laminated chip assemblies before arriving at the laminated chip assembly where the signal is actually used.

Three-dimensional Matrices of Laminated Chip Assemblies

Figure 5:
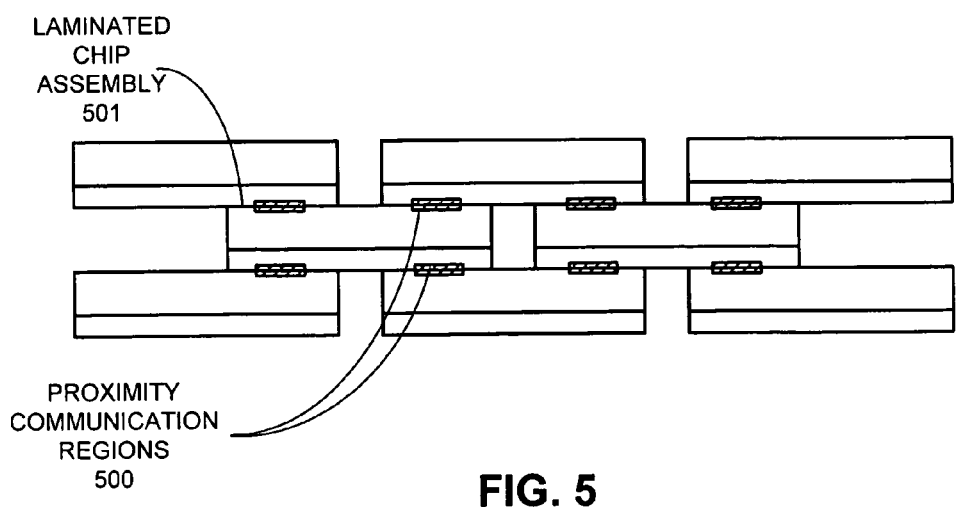
FIG. 5 illustrates a three-dimensional structure composed of layers of two-dimensional arrays of laminated chip assemblies in accordance with an embodiment of the present invention.

FIG. 5 illustrates a three-dimensional structure composed of layers of two-dimensional arrays of laminated chip assemblies in accordance with an embodiment of the present invention. As mentioned with respect to FIG. 3, laminated chip assemblies can have proximity communication regions on both the top and bottom faces. For example, proximity communication regions 501 include a proximity communication region on both the top and bottom faces of laminated chip assembly 500. When laminated chip assemblies have proximity communication regions on both top and bottom faces, layers of two-dimensional tiled arrays assembled from these laminated chip assemblies can be stacked into a three-dimensional matrix.

Power Connections to Laminated Chip Assemblies

Power can be supplied to the stack of semiconductor chips by a number of mechanisms. To avoid permanent attachment, power can be capacitively coupled, inductively coupled, or coupled by a combination of these two techniques. Also, to avoid permanent attachment, power can be conductively coupled through springs, micro-springs, fuzz buttons, or anisotropic sheets. Furthermore, semi-permanent attachment methods can bring in power conductively, thereby permitting limited re-work during assembly to replace defective laminated chip assemblies in stacks of semiconductor chips.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that includes a stack of semiconductor chips, comprising:
   a plurality of laminated chip assemblies, wherein each laminated chip assembly is comprised of multiple semiconductor chips, which are permanently laminated together, and that communicate with each other through electrically conductive connections;
   wherein the plurality of laminated chip assemblies are stacked together to form a stack of semiconductor chips, but are not permanently bonded to each other; and
   wherein laminated chip assemblies communicate with each other through capacitive coupling.

2. The apparatus of claim 1, wherein by stacking (but not permanently bonding) laminated chip assemblies together to form the stack, the yield problem that exists for large stacks of permanently bonded semiconductor chips is reduced, while the interconnection constraints imposed by the face-to-face chip orientation required for capacitive coupling are reduced.

3. The apparatus of claim 1, further comprising a power supply mechanism that supplies power to the stack of semiconductor chips while avoiding permanent attachment to the stack of semiconductor chips.

4. The apparatus of claim 3, wherein the power supply mechanism transfers power to the stack of semiconductor chips through one or more of the following:
   capacitive coupling;
   inductive coupling;
   springs;
   fuzzbuttons; and
   anisotropic sheets.

5. The apparatus of claim 1, wherein the electrically conductive connections between semiconductor chips in a laminated chip assembly involve through-chip vias.

6. The apparatus of claim 1, wherein the semiconductor chips in a laminated chip assembly can be different sizes or can have different thicknesses.

7. The apparatus of claim 1, wherein the stack of semiconductor chips includes an array of laminated chip assemblies, which have capacitive communication surfaces that are alternately oriented face-up and face-down.

8. The apparatus of claim 6, wherein the array of laminated chip assemblies is two-dimensional.

9. The apparatus of claim 7, wherein laminated chip assemblies are stacked to form a three-dimensional array.

10. The apparatus of claim 1, wherein a laminated chip assembly includes a chip carrier, which is laminated to one or more semiconductor chips; wherein the chip carrier is used to transfer signals from one laminated chip assembly to another laminated chip assembly.

11. A computer system that includes semiconductor chips, which are stacked together, comprising:
    a processor;
    a main memory;
    a plurality of laminated chip assemblies, wherein each laminated chip assembly is comprised of multiple semiconductor chips, which are permanently laminated together, and that communicate with each other through electrically conductive connections;
    wherein the laminated chip assemblies are stacked together to form a stack of semiconductor chips, but are not permanently bonded to each other; and
    wherein laminated chip assemblies communicate with each other through capacitive coupling.

12. The computer system of claim 11, wherein by stacking (but not permanently bonding) laminated chip assemblies together to form the stack, the yield problem that exists for large stacks of permanently bonded semiconductor chips is reduced, while reducing the interconnection constraints imposed by the face-to-face chip orientation required for capacitive coupling.

13. The computer system of claim 11, further comprising a power supply mechanism that supplies power to the stack of semiconductor chips while avoiding permanent attachment to the stack of semiconductor chips.

14. The computer system of claim 13, wherein the power supply mechanism transfers power to the stack of semiconductor chips through one or more of the following:

capacitive coupling;

inductive coupling;

springs;

fuzzbuttons; and anisotropic sheets.

15. The computer system of claim 11, wherein the electrically conductive connections between semiconductor chips in a laminated chip assembly involve through-chip vias.

16. The computer system of claim 11, wherein the semiconductor chips in a laminated chip assembly can be different sizes and can have different thicknesses.

17. The computer system of claim 11, wherein the stack of semiconductor chips includes an array of laminated chip assemblies, which have capacitive communication surfaces that are alternately oriented face-up and face-down.

18. The computer system of claim 17, wherein the array of laminated chip assemblies is two-dimensional.

19. The computer system of claim 18, wherein laminated chip assemblies are stacked to form a three-dimensional array.

20. The computer system of claim 11, wherein a laminated chip assembly includes a chip carrier, which is laminated to one or more semiconductor chips.

* * * * *